(12) United States Patent
Yamanouchi

(10) Patent No.: US 7,855,599 B2
(45) Date of Patent: Dec. 21, 2010

(54) POWER AMPLIFIER

(75) Inventor: Shingo Yamanouchi, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/524,263

(22) PCT Filed: Dec. 27, 2007

(86) PCT No.: PCT/JP2007/075055
§ 371 (c)(1),
(2), (4) Date: Jul. 23, 2009

(87) PCT Pub. No.: WO2008/090712
PCT Pub. Date: Jul. 31, 2008

(65) Prior Publication Data
US 2010/0109769 A1    May 6, 2010

(30) Foreign Application Priority Data
Jan. 24, 2007  (JP) .............................. 2007-013746

(51) Int. Cl.
*H03G 3/20* (2006.01)
(52) U.S. Cl. .................... 330/136; 330/124; 330/297
(58) Field of Classification Search ............. 330/136, 330/127, 297, 134, 10; 375/297; 455/127.1
See application file for complete search history.

(56) References Cited

U.S. PATENT DOCUMENTS 6,130,910 A * 10/2000 Anderson et al. ........... 375/238
2004/0263246 A1   12/2004  Robinson et al.
2005/0164660 A1    7/2005  Matsuura et al.

FOREIGN PATENT DOCUMENTS

| JP | 2005-020694 A | 1/2005 |
|----|---------------|--------|
| JP | 2005-184273 A | 7/2005 |
| JP | 2005-244950 A | 9/2005 |
| JP | 2006-093872 A | 4/2006 |
| JP | 2006-254345 A | 9/2006 |
| JP | 2006-287770 A | 10/2006 |
| JP | 2002-325109 A | 11/2008 |

* cited by examiner

*Primary Examiner*—Hieu P Nguyen
(74) *Attorney, Agent, or Firm*—Sughrue Mion, PLLC

(57) ABSTRACT

A power amplifier is provided with a signal generating circuit, a plurality of control signal amplifiers and an RF amplifier. The signal generating circuit outputs the amplitude modulation components of an input signal by dividing the components into a plurality of control signals, and outputs a modulation wave signal or the phase modulation components of the modulation wave signal. The control signal amplifier is provided with a pulse modulator, which performs pulse modulation of a control signal; a switching amplifier, which performs current amplification of a rectangular wave signal outputted from the pulse modulator; and a low-pass filter, which removes spurious components from the signal outputted from the switching amplifier. The RF amplifier amplifies the inputted signal, performs amplitude modulation with the signal outputted from the low-pass filter and outputs the amplitude-modulated signal.

26 Claims, 8 Drawing Sheets

$$a_1(t) = \begin{cases} C_1 a_1(t), \text{(if } a(t) < a_{ref}) \\ a_{ref1}, \text{(if } a(t) > a_{ref}) \end{cases} \qquad a_2(t) = \begin{cases} a_{ref2}, \text{(if } a(t) < a_{ref}) \\ C_2 a_2(t), \text{(if } a(t) > a_{ref}) \end{cases}$$

$a_{ref}$, $a_{ref1}$, $a_{ref2}$, $C_1$ and $C_2$ are constants.
(continuity condition: $a_{ref1} = C_1 a_{ref}$, $a_{ref2} = C_2 a_{ref}$)

POWER AMPLIFIER

TECHNICAL FIELD

The present invention relates to a power amplifier having high linearity and power efficiency, which is generally used in wireless communication devices.

BACKGROUND ART

The transmitting power amplifier of a wireless communication device is the unit that consumes the major amount of power in the wireless communication device. Thus, improvement in the power efficiency of the power amplifier is an important challenge for the development of the wireless communication device. According to recent wireless communication standards, improvement in spectrum efficiency using linear modulation is becoming a trend. Since an amplitude modulation mode has strict requirements for signal distortion, the power amplifier is required to operate in a high back-off (low input power) state where good linearity is obtained. However, operation in the high back-off state lowers the power efficiency of the power amplifier. For this reason, as an attempt to maintain the linearity of input and output signals while improving the power efficiency of the power amplifier, Envelope Elimination and Restoration (EER) has been under active research recently.

The EER is a technique designed to amplify an input signal (i.e., a modulated wave signal) including an Amplitude Modulation (AM) component and a Phase Modulation (PM) component with high efficiency. The EER technique restores an original waveform while linearly amplifying an input signal by extracting an AM component from the input signal, amplifying only a remaining PM component, and modulating the amplitude of the amplified PM component using the extracted AM component. FIG. 1 illustrates a configuration of a power amplifier of the background art to which the EER technique is applied.

As shown in FIG. 1, the power amplifier of the background art to which the EER technique is applied includes signal generating circuit 147, Radio Frequency (RF) amplifier 109, pulse modulator 104, driver amplifier 116, switching amplifier 105, low-pass filter 106 and band-pass filter 107.

Signal generating circuit 147 extracts an AM component from an input signal, and outputs the AM components as amplitude component signal 111 through terminal 145 to pulse modulator 104. Signal generator 147 also extracts a PM component from the input signal, and outputs the PM component as a phase component signal through terminal 146 to amplifier 109.

Pulse modulator 104 generates a square wave by pulse-modulating amplitude component signal 111, and outputs the square wave to driver amplifier 116.

Driver amplifier 116 drives switching amplifier 105 according to the square wave signal outputted from pulse modulator 104, thereby efficiently amplifying the square wave signal. After the amplification, the low-pass filter removes a spurious component from the square wave signal, which is in turn fed as a supply voltage through terminal 142 to RF amplifier 109.

RF amplifier 109 includes transistor 101, input power circuit 108 and output power circuit 140, and amplifies phase component signal 112 outputted from signal generating circuit 147. Here, an output signal of amplifier 109 is amplitude-modulated by an output signal of low-pass filter 106, that is, amplified amplitude component signal 114. In the meantime, a constant direct voltage is supplied from a power supply (not shown) generally through terminal 141 to input power circuit 108 connected to a gate of transistor 101.

band-pass filter 107 removes out-of-band components from a signal amplified using RF amplifier 109 (i.e., output signal 115), which is in turn supplied through terminal 144 to for example an antenna device (not shown).

FIG. 2 is a block diagram illustrating one configuration of the signal generating circuit shown in FIG. 1, and FIG. 3 is a block diagram illustrating another configuration of the signal generating circuit shown in FIG. 1. Signal generating circuit 147 shown in FIG. 2 is of an optimum configuration to be used when an RF signal is inputted to input terminal 143 of the power amplifier. Signal generating circuit 147 shown in FIG. 3 is of an optimum configuration to be used when a baseband signal is inputted to input terminal 143 of the power amplifier.

Signal generating circuit 147 shown in FIG. 2 includes amplitude detector 103 extracting an AM component from an input signal such as an RF signal and outputting an amplitude component signal and limiter 102 extracting an AM component from the input signal. Amplitude detector 103 extracts an AM component from an input signal (i.e., a modulated wave signal) inputted through terminal 143 and outputs an amplitude component signal through terminal 145. Limiter 102 removes an AM component from the input signal inputted through terminal 143 and outputs a phase component signal having a remaining PM component through terminal 146.

Signal generating circuit 147 shown in FIG. 3 includes baseband signal processing circuit 150 and Voltage Controlled Oscillator (VCO) 151. Baseband signal processing circuit 150 preferably includes a Digital Signal Processor (DSP) and a Digital/Analog (D/A) converter. Baseband signal processing circuit 150 outputs an amplitude component signal (i.e., an AM component) of a baseband signal (i.e., an input signal) through terminal 145, and outputs a signal for controlling an output frequency to VCO 151. Baseband signal processing circuit 150 calculates and extracts an AM component from the baseband signal inputted through terminal 143 by digitization using the DSP, up-converts the AM component, converts the AM component into an analog signal using the D/A converter, and then outputs the analog signal as amplitude component signal 111 through terminal 145. In addition, baseband signal processing circuit 150 calculates and extracts a PM component from the baseband signal inputted through terminal 143 by digitization using the DSP, generates a control signal for outputting a phase component signal from VCO 151, converts the PM component into an analog signal using the D/A converter, and outputs the analog signal to VCO 151. VCO 151 outputs an up-converted phase component signal on an RF frequency in response to the control signal from baseband signal processing circuit 150.

The power amplifier shown in FIG. 1 operates transistor 101 of RF amplifier 109 always in a saturated state by outputting phase component signal 112 with sufficient power from signal generating circuit 147. In addition, the power amplifier modulates the amplitude of phase component signal 112 amplified by transistor 101 using amplitude component signal 114 by supplying amplitude component signal 114 through terminal 142 and output power circuit 140 to the drain of transistor 101 of RF amplifier 109. Accordingly, the power amplifier can maintain the linearity of input and output signals while amplifying the input signal with high power efficiency. In addition, the power amplifier to which the EER technique is applied has been disclosed for example in Japanese Patent Publication No. 2005-184273.

Envelope Tracking (ET) is also known as another technique for improving power efficiency while maintaining the linearity of the power amplifier.

The ET is a technique designed to improve power efficiency while maintaining the linearity of input and output signals by amplifying an input signal including AM and PM components, extracting the AM component from the input signal, and modulating the amplitude of the amplified signal using the extracted AM component. FIG. 4 illustrates a configuration of a power amplifier of the background art to which the ET technique is applied.

As shown in FIG. 4, the power amplifier of the background art to which the ET technique is applied differs in the configuration and operation of signal generating circuit 148 from the power amplifier of FIG. 1 to which the EET technique is applied. Other constructions and operations are the same as in the power amplifier shown in FIG. 1 to which the EER technique is applied, and thus a description thereof will be omitted. In FIG. 4, the same or similar reference numerals as in the power amplifier shown in FIG. 1 are used to designate the same or similar components, except for signal generating circuit 148.

Signal generating circuit 148 extracts an AM component from an input signal, and outputs the AM component as amplitude component signal 111 through terminal 145 to pulse modulator 140. In addition, signal generating circuit 148 outputs modulated wave signal 149, proportional to the amplitude of the input signal containing AM and PM components, through terminal 146 to RF amplifier 109.

FIG. 5 is a block diagram illustrating one configuration of the signal generating circuit shown in FIG. 4, and FIG. 6 is a block diagram illustrating another configuration of the signal generating circuit shown in FIG. 4. Signal generating circuit 148 shown in FIG. 5 is of an optimum configuration to be used when an RF signal is inputted to input terminal 143 of the power amplifier, and signal generating circuit shown in FIG. 6 is of an optimum configuration to be used when a baseband signal is inputted to input terminal 143 of the power amplifier.

Signal generating circuit 148 shown in FIG. 5 includes amplitude detector 130 extracting an AM component from an RF signal (i.e., a modulated wave signal) and outputting the AM component as amplitude component signal 111. Amplitude detector 103 extracts an AM component from an input signal inputted through terminal 143, and outputs the AM component as amplitude component signal 111 through terminal 145. The input signal inputted through terminal is supplied to amplitude detector 130 and at the same time outputted as modulated wave signal 149 through terminal 146.

Signal generating circuit 148 shown in FIG. 6 includes baseband signal processing circuit 150 and quadrature modulator 152. Baseband signal processing circuit 150 calculates and extracts an AM component from the baseband signal inputted through terminal 143 by digitization using the DSP, converts the AM component into an analog signal using the D/A converter, and then outputs the analog signal as amplitude component signal 111 through terminal 145. In addition, baseband signal processing circuit 150 converts the input baseband signal into an analog signal using the D/A converter, and outputs the analog signal to quadrature modulator 152.

Quadrature modulator 152 up-converts the baseband signal outputted from baseband signal processing circuit 150 to an RF frequency, and outputs the up-converted baseband signal as modulated wave signal 149 through terminal 146.

The power amplifier shown in FIG. 4 has the function of limiter 102 of FIG. 2 in RF amplifier 109 by outputting modulated wave signal 149 with sufficient power from signal generating circuit 148 and thereby operates transistor 101 of RF amplifier 109 always in a saturated state. That is, the power amplifier to which the EER technique is applied and the power amplifier to which the ET technique is applied operate according to the same principle except that a PM component of an input signal is inputted into RF amplifier 109 in the EER technique but modulated wave signal 149 including AM and PM components is inputted into RF amplifier 109 in the ET technique. Therefore, the power amplifier to which the ET technique is applied can maintain linearity of input and output signals while amplifying the input signal with high power efficiency.

However, the power amplifiers of the background art as mentioned above have the following problem: As shown in FIG. 7, the power efficiency of switching amplifier 105 drops when the output power (i.e., average power) of switching amplifiers 105 shown in FIGS. 1 and 4 decreases. The power efficiency of switching amplifier 105 is dependent on the output power since the power loss of switching amplifier 105 with respect to the output power of switching amplifier 105 cannot be neglected in the low power mode.

The main reasons for the power loss of the switching amplifier include switching loss caused by overlapping current and voltage during switching from "on" to "off" or from "off" to "on", or conduction loss caused by on-resistance. The dropping power efficiency of switching amplifier 105 also leads to a decline in the entire power efficiency of the power amplifying circuit.

SUMMARY

Therefore, it is an exemplary object of the present invention to provide a power amplifier having higher power efficiency than those of the background art by suppressing a decrease in the power efficiency of a switching amplifier.

In order to achieve the above object, the exemplary aspect of the invention provides a power amplifier for amplifying a modulated wave signal containing Amplitude Modulation (AM) and Phase Modulation (PM) components may include a signal generating circuit extracting an AM component from the modulated wave signal, outputting the AM component by dividing the AM component into a plurality of control signals, and extracting and outputting a PM component from the modulated wave signal; a plurality of control signal amplifiers, wherein each of the control signal amplifiers includes a pulse modulator modulating a pulse of the control signals, a switching amplifier amplifying a current of a square wave signal from the pulse modulator, and a low-pass filter removing a spurious component caused by the square wave signal from an output signal of the switching amplifier; and a Radio Frequency (RF) amplifier outputting the PM component by amplifying the PM component and performing amplitude modulation on the PM component using an output signal from the low-pass filter. An output signal from the low-pass filter of the first control signal amplifier is fed as a supply voltage to the RF amplifier, and an output signal from the low-pass filter of the $n^{th}$ control signal amplifier is fed as a supply voltage to the switching amplifier of the $n-1^{th}$ control signal amplifier, where n is an integer greater than 2.

In order to realize the above object, the power amplifier for amplifying a modulated wave signal containing AM and PM components may include a signal generating circuit extracting the AM component from the modulated wave signal, outputting an AM component by dividing the AM component into a plurality of control signals, and outputting the modulated wave signal; a plurality of control signal amplifiers, wherein each of the control signal amplifiers includes a pulse modulator modulating a pulse of the control signals, a switching amplifier amplifying a current of a square wave signal from the pulse modulator, and a low-pass filter removing a spurious component caused by the square wave signal from an output signal of the switching amplifier; and an RF amplifier outputting the modulated wave signal by amplifying the modulated wave signal while performing amplitude modulation on the modulated wave signal using an output signal from the low-pass filter. An output signal from the low-pass filter of the first control signal amplifier is fed as a supply voltage to the RF amplifier, and an output signal from the low-pass filter of the $n^{th}$ control signal amplifier is fed as a supply voltage to the switching amplifier of the $n-1^{th}$ control signal amplifier, where n is an integer greater than 2.

EXEMPLARY EMBODIMENT

The invention will now be described hereinafter with reference to the accompanying drawings.

First Exemplary Embodiment

Figure 1:
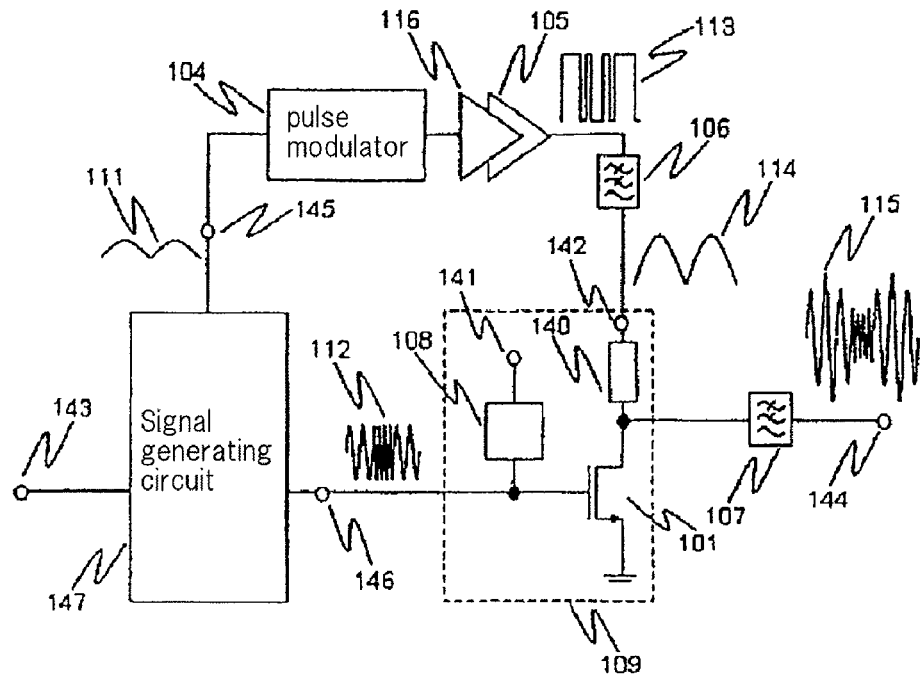
FIG. 1 is a block diagram illustrating a configuration of a power amplifier of the background art to which the EER technique is applied.
Figure 2:
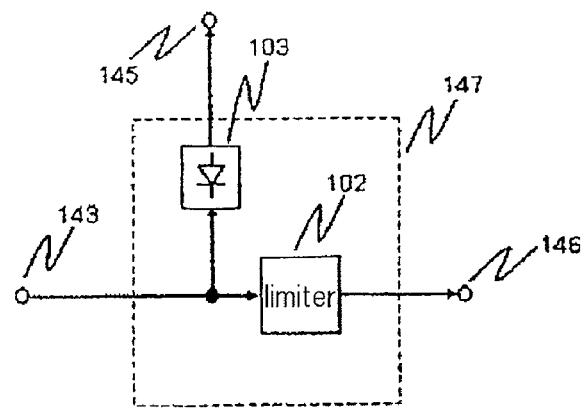
FIG. 2 is a block diagram illustrating one configuration of the signal generating circuit shown in FIG. 1.
Figure 3:
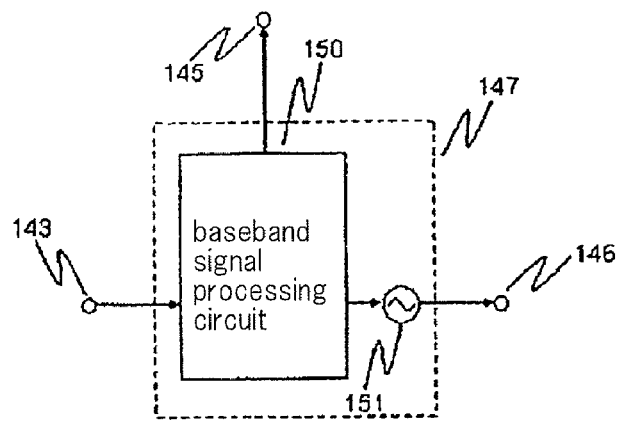
FIG. 3 is a block diagram illustrating another configuration of the signal generating circuit shown in FIG. 1.
Figure 4:
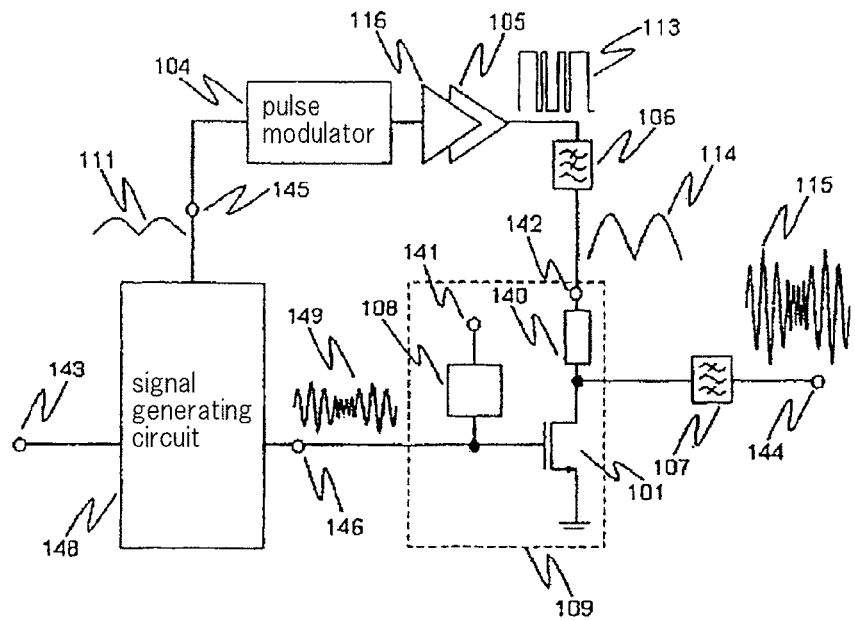
FIG. 4 is a block diagram illustrating a configuration of a power amplifier of the background art to which the ET technique is applied.
Figure 5:
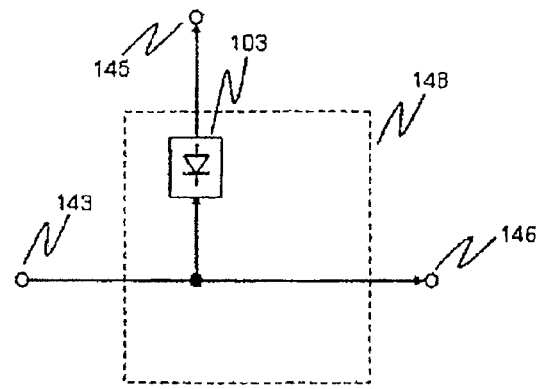
FIG. 5 is a block diagram illustrating one configuration of the signal generating circuit shown in FIG. 4.
Figure 6:
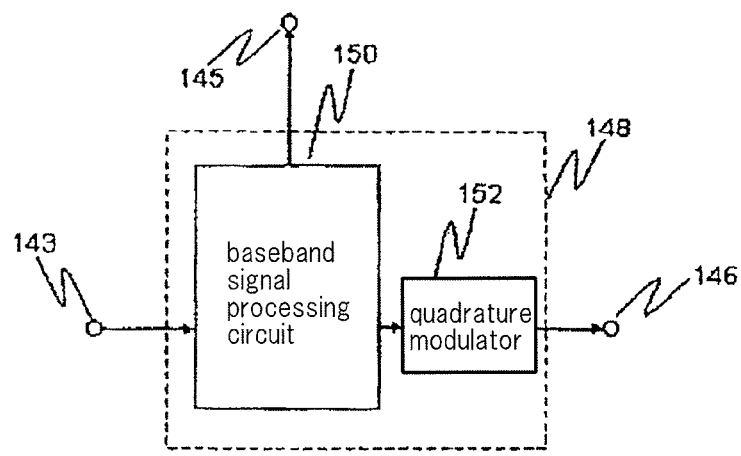
FIG. 6 is a block diagram illustrating another configuration of the signal generating circuit shown in FIG. 4.
Figure 7:
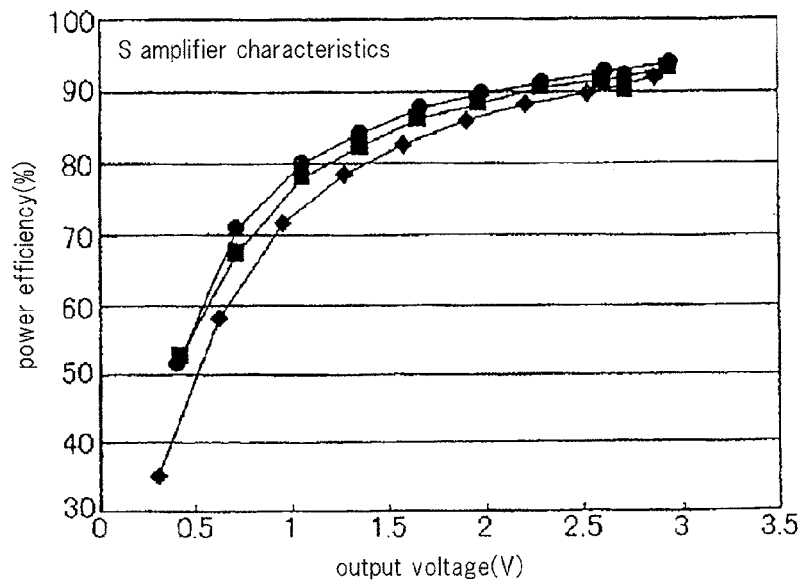
FIG. 7 is a graph illustrating the relationship of power efficiency with respect to output power in the switching amplifiers shown in FIGS. 1 and 4.
Figure 8:
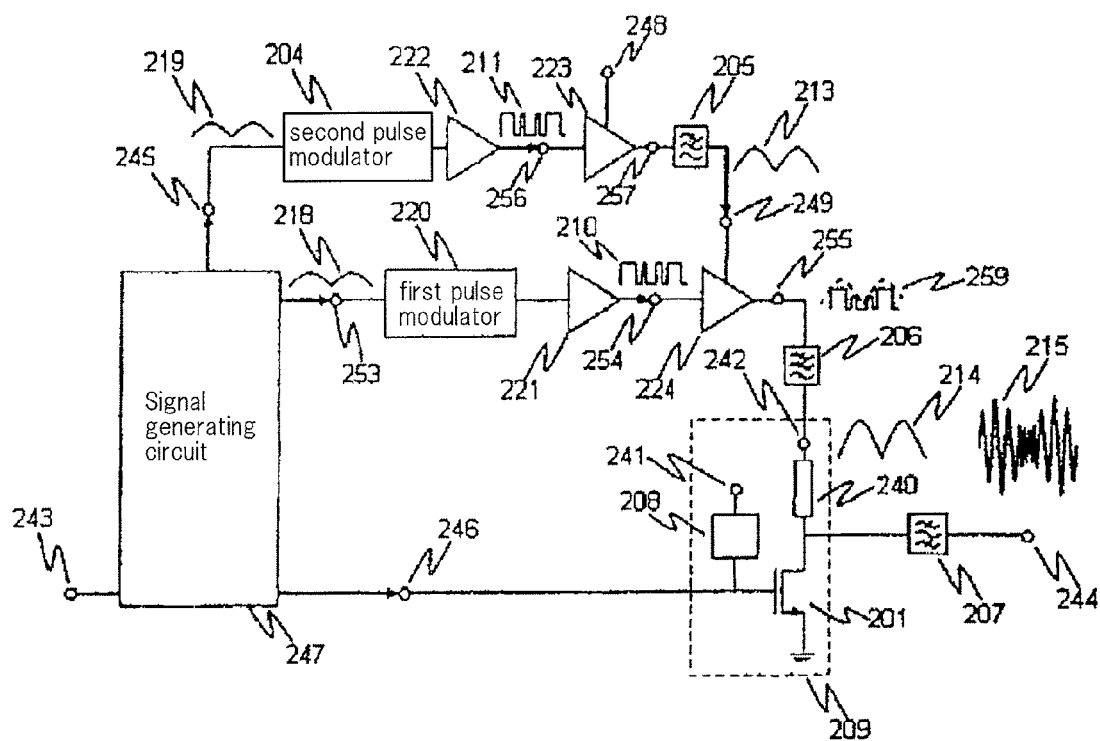
FIG. 8 is a block diagram illustrating a configuration of a power amplifier according a first embodiment of the invention.

As shown in FIG. 8, a power amplifier according to a first embodiment of the invention includes signal generating circuit 247, RF amplifier 209, first pulse modulator 220, first driver amplifier 221, first switching amplifier 224, second pulse amplifier 204, second driver amplifier 222, second switching amplifier 223, first low-pass filter 206, second low-pass filter 205 and band-pass filter 207.

Signal processing circuit 247 extracts an AM component from an input signal, outputs first control signal 218 generated from the AM component through terminal 253 to first pulse modulator 220, and outputs second control signal 219 generated from the AM component through terminal 254 to second pulse modulator 204. In this embodiment, when the AM component of the input signal is set a(t), amplitude component $a_1(t)$ is outputted as first control signal 218 to first pulse modulator 220, and amplitude component $a_2(t)$ is outputted as second control signal 219 to second pulse modulator 204, where amplitude components $a_1(t)$ and $a_2(t)$ have a dynamic range smaller than AM component a(t) and satisfy the following relationship: a(t) proportional to $a_1(t)a_2(t)$. In addition, signal generating circuit 247 extracts a PM component from the input signal and outputs the PM component as a phase component signal through terminal 246 to RF amplifier 209. Signal generating circuit 247 can preferably have a function of controlling the delay time difference between first control signal 218 and the phase component signal and between second control signal 219 and the phase component signal.

First pulse modulator 220 generates a square wave signal having constant amplitude by pulse-modulating first control signal 218, and outputs the square wave signal to first driver amplifier 221. First pulse modulator 220 can be implemented with a Pulse Width Modulation (PWM) modulator, a delta modulator, a delta-sigma modulator, and the like. First pulse modulator 220 can be implemented with any circuits as long as they can convert first control signal 218, outputted from signal generating circuit 247, into a square wave signal having constant amplitude.

First driver amplifier 221 drives first switching amplifier 224 according to the square wave signal outputted from first pulse modulator, and first switching modulator 224 efficiently amplifies the current of the square wave signal. The amplified square wave signal is outputted as a supply voltage through terminal 242 to RF amplifier 209 after a spurious component is removed from the square wave signal by first low-pass filter 206. First switching amplifier 224 can be implemented with an amplifier capable of amplifying square wave signals with a high efficiency such as Class-D, Class-E and Class-S amplifiers. In the meantime, when first pulse modulator 220 has a configuration capable of outputting a sufficient strength of signal for driving switching amplifier 224, first driver amplifier 221 can be omitted.

Second pulse modulator 204 generates a square wave signal by pulse-modulating second control signal 219, and outputs the square wave signal to second driver amplifier 222. Like first pulse modulator 220, second pulse modulator 204 can be implemented with a PWM modulator, a delta modulator, a delta-sigma modulator and the.

Second driver amplifier 222 drives second switching amplifier 223 according to a square wave signal outputted from second pulse modulator 204, and second switching amplifier 223 efficiently amplifies the current of the square wave signal. The amplified square wave signal is outputted as a supply voltage through terminal 249 to first switching amplifier 224 after a spurious component is removed from the square wave signal by second low-pass filter 205. Second switching amplifier 223 can be implemented with an amplifier capable of amplifying square wave signals with a high efficiency such as Class-D, Class-E and Class-S amplifiers. In the meantime, when second pulse modulator 204 has a configuration capable of outputting a sufficiently strong signal to drive switching amplifier 223, second driver amplifier 222 can be omitted.

RF amplifier 209 includes transistor 201, input bias circuit 208 and output bias circuit 240, and amplifies an output signal of signal generating circuit 247. Here, an output signal of RF amplifier 209 is amplitude-modulated by an output signal of first low-pass filter 206, that is, an amplified amplitude component signal through terminal 242. As in the background art, a constant direct voltage is supplied from a power supply (not shown) through terminal 241 to input bias circuit 208 connected to the gate of transistor 201. In the meantime, transistor 201 can be implemented with any one of a Field Effect Transistor (FET) and a bipolar transistor.

Band-pass filter 207 removes an unnecessary spurious component caused by a square wave signal from the signal amplified by RF amplifier 209, and desired RF signal 215 that is obtained by linearly amplifying an input signal is supplied through terminal 244 to, for example, an antenna device (not shown).

Figure 9:
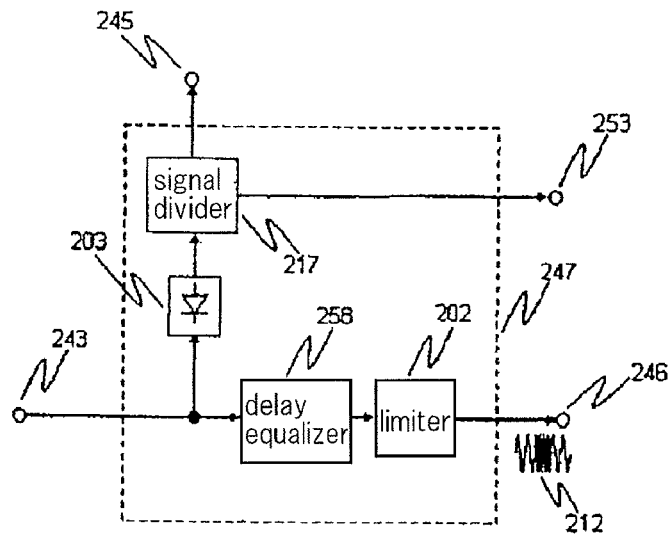
FIG. 9 is a block diagram illustrating one configuration of the signal generating circuit shown in FIG. 8.
Figure 10:
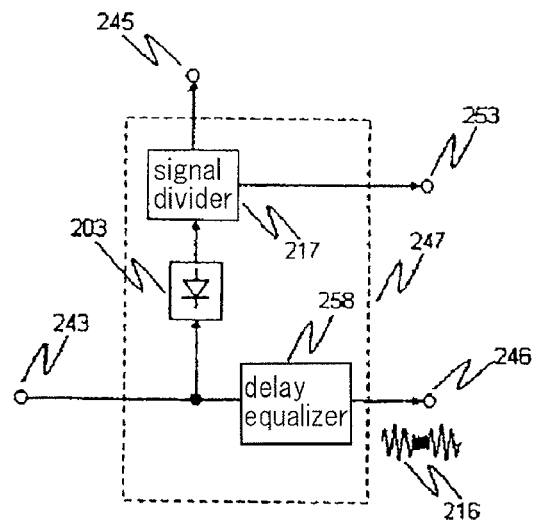
FIG. 10 is a block diagram illustrating another configuration of the signal generating circuit shown in FIG. 8.

FIG. 9 is a block diagram illustrating one configuration of the signal generating circuit shown in FIG. 8, and FIG. 10 is a block diagram illustrating another configuration of the signal generating circuit shown in FIG. 8. Signal generating circuit 247 shown in FIGS. 9 and 10 is of an optimum configuration to be used when an RF signal is inputted to input terminal 243 of the power amplifier shown in FIG. 8. Specifically, FIG. 9 illustrates a configuration of signal generating circuit 247 in the case where the EER technique is applied to the power amplifier shown in FIG. 8, and FIG. 10 illustrates a configuration of signal generating circuit 247 in the case where the ET technique is applied to the power amplifier shown in FIG. 8.

Signal generating circuit 247 shown in FIG. 9 includes amplitude detector 203 extracting an AM component from an input RF signal, limiter 202 extracting an AM component from the input signal, and signal divider 217 dividing the AM component of the input signal extracted by amplitude detector 203. In addition, signal generating circuit 247 shown in FIG. 9 includes delay equalizer 258, which allows controlling the delay time difference between the AM component of the input signal extracted by amplitude detector 203 and a PM component extracted by limiter 202.

Amplitude modulator 203 extracts the AM component of the RF signal (i.e., a modulated wave signal) inputted from terminal 243, and outputs the AM component to signal divider 217. Signal divider 217 divides AM component a(t) of the input signal with amplitude components $a_1(t)$ and $a_2(t)$ satisfying the following relationship: a(t) proportional to $a_1(t)$ $a_2(t)$, outputs first control signal 218 having amplitude component $a_1(t)$ through terminal 253, and outputs second control signal 219 having amplitude component $a_2(t)$ through terminal 245. Limiter 202 removes the AM component of the RF signal, the delay time of which is controlled by delay equalizer 258, and outputs the remaining PM component as phase component signal 212 through terminal 246.

Signal divider 217 can be implemented with for example a Digital Signal Processor (DSP), equipped with an Analog-to-Digital (A/D) converter or a D/A converter, or an operation circuit constructed with an analog circuit. Signal divider 217 can preferably have a function of properly controlling the time difference between first control signal 218 and second control signal 219 outputted from signal divider 217.

While an example in which analog signals are outputted as first and second signals 218 and 219 from signal processing circuit 247 has been illustrated with reference to FIG. 8, signal processing circuit 247 can have functions of first pulse modulator 220 and second pulse modulator 204 when signal processing circuit 247 includes signal divider 217 constructed with a DSP. In this case, first control signal 218 can be directly inputted to first driver amplifier 221, and second control signal 219 can be directly inputted to second driver amplifier 222.

In addition, as shown in FIG. 10, signal processing circuit 247 can have the same configuration as the circuit shown in FIG. 9 except that limiter 202 is excluded. In the configuration shown in FIG. 10, a modulated wave signal containing AM and PM components is outputted from terminal 246. Amplitude detector 203, signal divider 217 and delay equalizer 258 have the same configuration and operation as in signal generating circuit 247 of FIG. 9.

Figure 11:
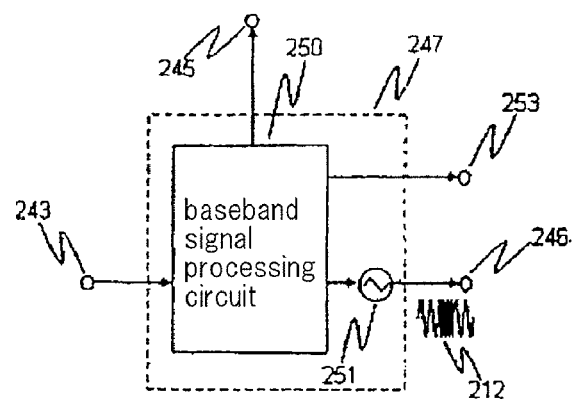
FIG. 11 is a block diagram illustrating a further configuration of the signal generating circuit shown in FIG. 8.
Figure 12:
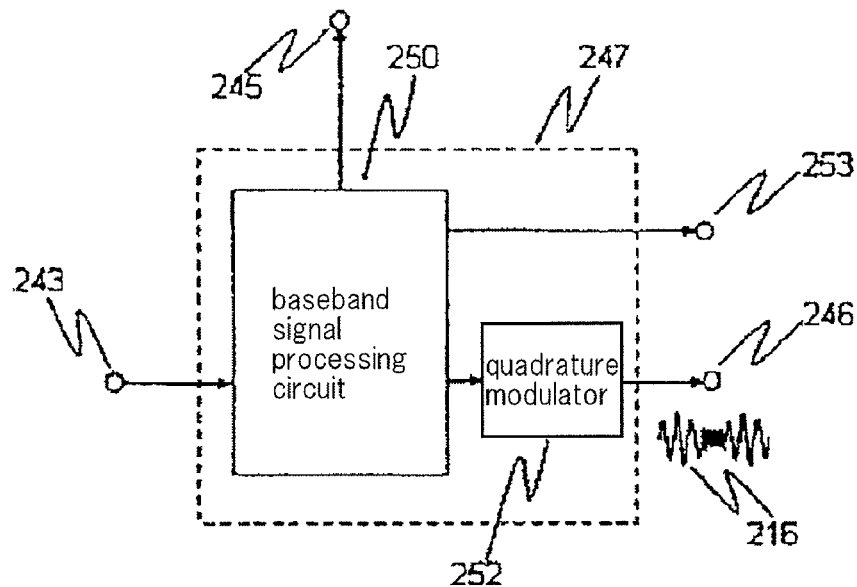
FIG. 12 is a block diagram illustrating still another configuration of the signal generating circuit shown in FIG. 8.

FIG. 11 is a block diagram illustrating a further configuration of the signal generating circuit shown in FIG. 8, and FIG. 12 is a block diagram illustrating still another configuration of the signal generating circuit shown in FIG. 8. Signal generating circuit 248 shown in FIGS. 11 and 12 is of an optimum configuration to be used when a baseband signal is inputted into input terminal 243 of the power amplifier shown in FIG. 8. Specifically, FIG. 11 illustrates a configuration of signal generating circuit 247 in the case where the EER technique is applied to the power amplifier shown in FIG. 8, and FIG. 12 illustrates a configuration of signal generating circuit 247 in the case where the ET technique is applied to the power amplifier shown in FIG. 8.

Signal processing circuit 247 shown in FIG. 11 includes baseband signal processing circuit 250 and VCO 251. Baseband signal processing circuit 250 preferably includes a DSP and a D/A converter. Baseband signal processing circuit 250 calculates and divides AM component a(t) of a baseband signal inputted from terminal 243 into amplitude components $a_1(t)$ and $a_2(t)$, which satisfy the following relationship: a(t) proportional to $a_1(t)a_2(t)$, by digitization, using the DSP. After the signals $a_1(t)$ and $a_2(t)$ are converted into analog signals by the D/A converter, amplitude component $a_2(t)$ is outputted as second control signal 219 through terminal 245. In addition, baseband signal processing circuit 250 calculates and extracts a PM component of the baseband signal inputted through terminal 243 by digitization, using the DSP. Baseband signal processing circuit 250 also generates a control signal for outputting a phase component signal from VCO 251, converts the control signal into an analog signal using the D/A converter, and outputs the signal to VCO 251. The function of baseband signal processing circuit 250 to control the delay time difference between the AM and PM components of the baseband signal can be preferably realized by the DSP.

The output frequency of VCO 251 is controlled by a control signal outputted from baseband signal processing circuit 250, and VCO 251 outputs a phase component signal that is up-converted to an RF frequency.

In the case where signal processing circuit 247 includes baseband signal processing circuit 250 constructed with the DSP, baseband signal processing circuit 250 may have functions of first pulse modulator 220 and second pulse modulator 204. Then, first control signal 218 may be directly inputted to first driver amplifier 221, and second control signal 219 may be directly inputted to second driver amplifier 222.

As shown in FIG. 12, signal generating circuit 247 can be provided with quadrature modulator 252 in place of VCO 251 shown in FIG. 11. In the configuration shown in FIG. 12, a modulated wave signal containing AM and PM components is outputted from terminal 246. Baseband signal processing circuit 250 have the same configuration and operation as in signal generating circuit 247 of FIG. 11.

In the power amplifier of the first embodiment, a signal amplified by second switching amplifier 223 is fed as a supply voltage to first switching amplifier 224 after a spurious component is removed from the signal by second low-pass filter 205. Accordingly, an output signal of first switching amplifier 224 is amplitude-modulated by output signal 213 of second low-pass filter 205.

Signal 214 proportional to the multiplication of first and second control signals 218 and 219, that is, the amplitude signal a(t), is obtained from first low-pass filter 206 by removing an overlapping spurious component of a square wave from output signal 259 of first switching amplifier 224 using first low-pass filter 206.

Like the power amplifier of the background art to which the EER or ET technique is applied, a phase component signal or a modulated wave signal containing AM and PM components, outputted from signal generating circuit, is inputted to RF amplifier 209. RF amplifier 209 amplifies the phase component signal or the modulated wave signal in saturation operating mode. Here, an output signal of RF amplifier 209 is amplitude-modulated by signal 214 outputted from first low-pass filter 206. The output signal of RF amplifier 209 is passed through band-pass filter 207, the frequency band of which is wider than the frequency band of a baseband signal and can remove a spurious component caused by a square wave signal. This as a result removes the unnecessary overlapping spurious component from the output signal of RF amplifier 209 thereby producing a desired RF signal that is a linearly amplified signal of the input signal.

As described above, in the power amplifier of the first embodiment, the dynamic range of first and second control signals 218 and 219 is set to be smaller than AM component a(t) of the original input signal. This as a result, suppresses a decline in the average output voltage and power efficiency of first and second switching amplifiers 224 and 223. Since first switching amplifier 224 operates using an output signal from second low-pass filter 205 as a supply voltage, the magnitude of the output signal varies according to the supply voltage. As a result, the supply voltage of respective switching amplifiers that is decreased in low power mode reduces switching loss proportional to the supply voltage more than a fixed amount of supply voltage does. This also suppresses a decline in power efficiency in the low power mode. In addition, since a signal having a narrower dynamic range than the original PM component is used as a control signal, low amplitude operation in the switching amplifier is avoided and thus a decline in power efficiency is suppressed. Accordingly, power efficiency in the low amplitude operation of the switching amplifier has improved that of the background art, and the entire power efficiency of the power amplifier is improved.

In the meantime, examples of first control signal 218 ($a_1(t)$) and second control signal 219 ($a_2(t)$) satisfying the relationship: a(t) proportional to $a_1(t)a_2(t)$ may be expressed by $a_1(t)$ proportional to $[a(t)]^{n1}$ and $a_2(t)$ proportional to $[a(t)]^{n2}$, where n1+n2=1. In this case, n1 and n2 are preferably in the following relationship: n1, n2<1, in order to satisfy the condition that the dynamic range of amplitude components $a_1(t)$ and $a_2(t)$ be smaller than that of AM component a(t). Here, $[a(t)]^{n1}$ and $[a(t)]^{n2}$ indicate exponentiation of a(t).

Figure 13:
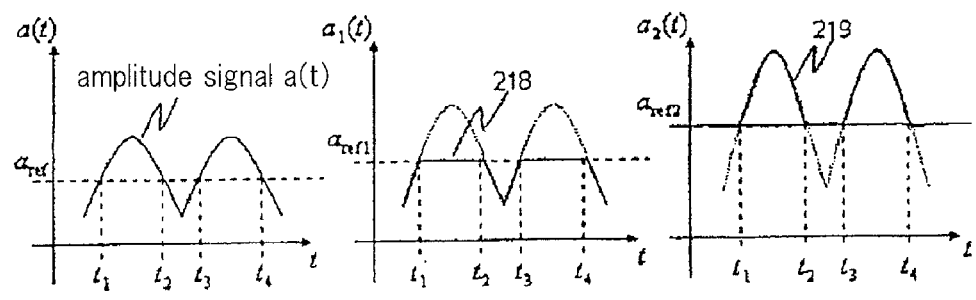
FIG. 13 is a graph illustrating examples of setting first and second control signals in the power amplifier shown in FIG. 8.

In addition, first control signal 218 ($a_1(t)$) and second control signal 219 ($a_2(t)$) can be set as shown in FIG. 13.

For example, when predetermined threshold $a_{ref}$ is previously assigned to AM component a(t), first control signal 218 can be set to be proportional to a(t) and second control signal 219 can be set to be fixed value $a_{ref}$ if AM component a(t) is smaller than its threshold $a_{ref}$. In addition, if a(t) is at least the threshold $a_{ref}$, first control signal 218 can be set to be fixed value $a_{ref}$ and second control signal 219 can be set to be proportional to a(t).

In other words, first control signal 218 is set to be a fixed value if a(t) is at least threshold $a_{ref}$, and is set to be proportional to a(t) if a(t) is smaller than threshold $a_{ref}$. In this case, second control signal 219 is set to be proportional to a(t) if a(t) is at least threshold $a_{ref}$, and is set to be a fixed value if a(t) is smaller than threshold $a_{ref}$.

Even when first and second control signals 218 and 219 are set as above, a decline in the power efficiency of second switching amplifier 223 is suppressed since the dynamic range of these signals is smaller than original AM component a(t). In addition, since first control signal 218 ($a_1(t)$) and second control signal 219 ($a_2(t)$) satisfy the relationship: a(t) proportional to $a_1(t)a_2(t)$, linear amplification of an input signal is realized. The same operation can be realized by exchanging the positions of $a_1(t)$ and $a_2(t)$.

The method of setting first and second control signals 218 and 219 is not limited to the above-described examples. Rather, any values can be adopted as long as at least one of first and second control signals 218 and 219 has a smaller dynamic range than original AM component a(t), where a(t) proportional to $a_1(t)a_2(t)$.

Second Exemplary Embodiment

Next, a description will be given of a power amplifier of a second embodiment with reference to the accompanying drawings.

Figure 14:
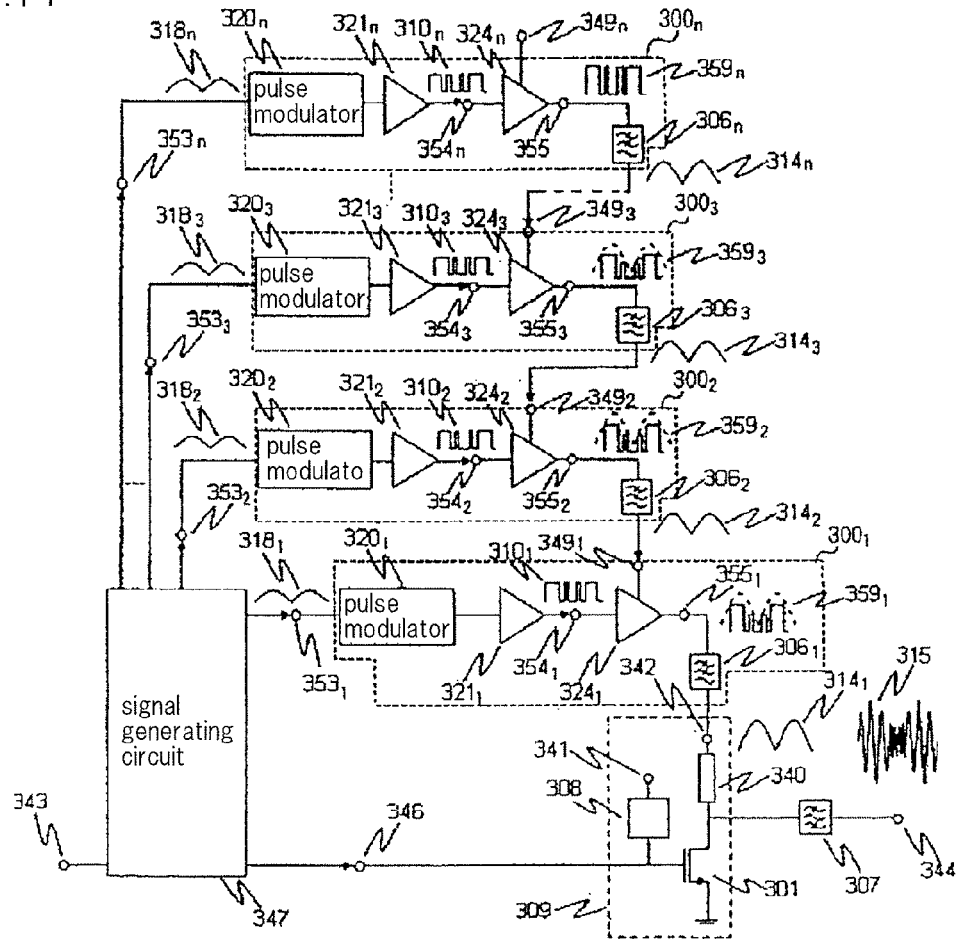
FIG. 14 is a block diagram illustrating a configuration of a power amplifier according to a second embodiment of the invention.

FIG. 14 is a block diagram illustrating a configuration of a power amplifier according to a second embodiment of the invention. Specifically, FIG. 14 illustrates the configuration of the power amplifier to which the EER technique is applied.

The configuration of the first embodiment has two sets of circuit blocks including a pulse modulator, a driver amplifier, a switching amplifier and a low-pass filter, and is configured to amplify two control signals outputted from signal generating circuit 247 using respective circuit blocks. The power amplifier of the second embodiment is configured to divide an AM component extracted from a modulated wave signal using a signal generating circuit into a plurality of control signals $a_1(t)$ to $a_n(t)$ and to amplify the plurality of control signals using a plurality of circuit blocks (i.e., control signal amplifying units) including a pulse modulator, a drive amplifier, a switching amplifier and a low-pass filter.

As shown in FIG. 14, the power amplifier of the second embodiment includes a plurality of control signal amplifying sections $300_1$ to $300_n$ (where n is an integer) that amplify a plurality of control signals outputted from signal generating circuit 347, RF amplifier 309, band-pass filter 307 and signal generating circuit 347.

Each of control signal amplifying units $300_1$ to $300_n$ includes a pulse modulator, a driver amplifier, a switching amplifier and a low-pass filter.

Pulse modulator $320_1$, driver amplifier $321_1$, switching amplifier $324_1$ and low-pass filter $306_1$ of control signal amplifying unit $300_1$ correspond to first pulse modulator 220, first driver amplifier 221, first switching amplifier 224 and first low-pass filter 206 illustrated in the first embodiment, and operate in the same manner. In addition, pulse modulators $320_2$ to $320_n$, driver amplifiers $321_2$ to $321_n$, switching amplifiers $324_2$ to $324_n$ and low-pass filters $306_2$-$306_n$ correspond to second pulse modulator 204, second driver amplifier 222, second switching amplifier 223 and second low-pass filter 205 illustrated in the first embodiment, and operate in the same manner.

In the power amplifier of the second embodiment, an output signal of low-pass filter $306_1$ of first control signal amplifier $300_1$ is fed as a supply voltage to RF amplifier 309, and an output signal of a low-pass filter of $n^{th}$ low-pass filter control signal amplifier $300_n$ is fed as a supply voltage to switching amplifier $324_{n-1}$ of $n-1^{th}$ control signal amplifier $300_{n-1}$. A supply voltage from a power supply (not shown) is supplied to switching amplifier $324_n$ of $n^{th}$ control signal amplifier $300_n$.

Signal generating circuit 347 extracts an AM component from the input signal, and outputs a plurality of control signals $318_1$ to $318_n$ generated from the AM component to pulse modulators $320_1$ to $320_n$ of control signal amplifiers $300_1$ to $300_n$ through terminals $353_1$ to $353_n$. In this embodiment, if the AM component of the input signal is set to be a(t), amplitude components $a_1(t)$ to $a_n(t)$, the dynamic range of which is smaller than that of AM component a(t) and which satisfy the following relationship: a(t) proportional to $a_1(t)a_2(t) \ldots a_n(t)$, are outputted as control signals $318_1$ to $318_n$ to control signal amplifying units $300_1$ to $300_n$. As in the first embodiment, signal generating circuit 347 extracts a PM component from the input signal and outputs the PM component as a phase component signal through terminal 346 to RF amplifier 309. Signal generating circuit 347 may have a function of controlling the delay time difference between respective control signals $318_1$ to $318_n$ and respective phase component signals.

RF amplifier 309 and band-pass filter 307 have the same configuration and operation as in the power amplifier of the first embodiment, and thus a description thereof will be omitted.

Pulse modulators $320_1$ to $320_n$ can be implemented with a PWM modulator, a delta modulator, a delta-sigma modulator, and the like as in the first embodiment. Pulse modulators $320_1$ to $320_n$ can be implemented with any circuits as long as they can convert control signals $318_1$ to $318_n$, that are outputted from signal generating circuit 347, into a square wave signal having constant amplitude.

In addition, switching amplifiers $324_2$ to $324_n$ can be implemented with an amplifier capable of amplifying square wave signals with a high efficiency such as Class-D, Class-E and Class-S amplifiers. In the meantime, when pulse modulators $320_1$ to $320_n$ have a configuration capable of outputting a sufficiently strong signal to drive switching amplifiers $324_2$ to $324_n$, driver amplifiers $321_2$ to $321_n$ can be omitted.

Figure 15:
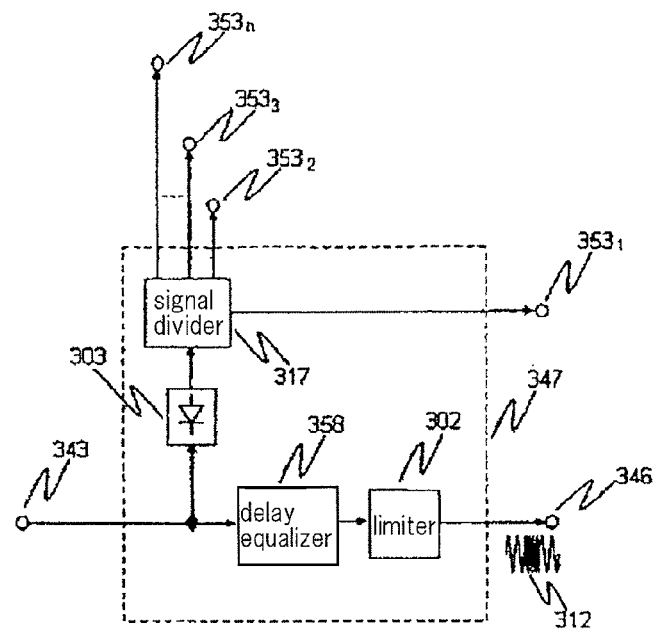
FIG. 15 is a block diagram illustrating one configuration of the signal generating circuit shown in FIG. 14.
Figure 16:
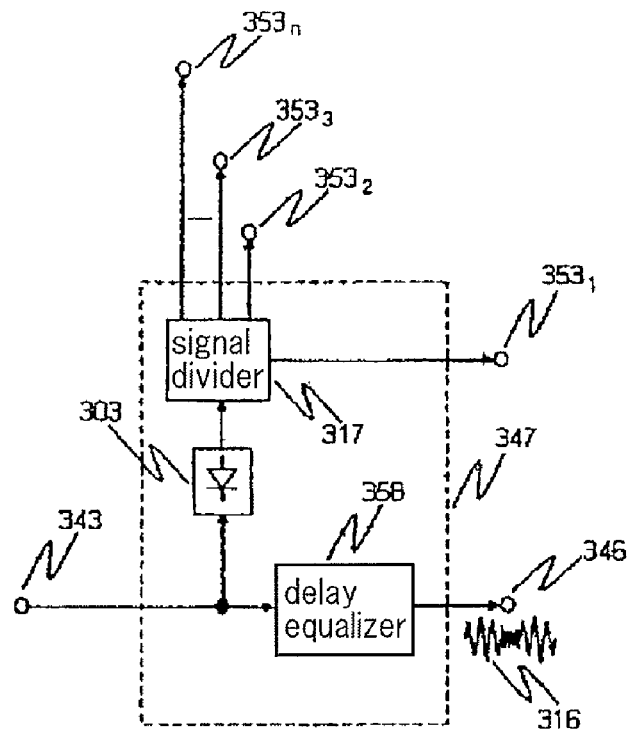
FIG. 16 is a block diagram illustrating another configuration of the signal generating circuit shown in FIG. 14.

FIG. 15 is a block diagram illustrating one configuration of the signal generating circuit shown in FIG. 14, and FIG. 16 is a block diagram illustrating another configuration of the signal generating circuit shown in FIG. 14. Signal generating circuit 347 shown in FIGS. 15 and 16 is of an optimum configuration to be used when an RF signal is inputted to input terminal 343 of the power amplifier shown in FIG. 14. Here, FIG. 15 illustrates a configuration of signal generating circuit 347 in which the EER technique is applied to the power amplifier shown in FIG. 14, and FIG. 16 illustrates a configuration of signal generating circuit 347 in which the ET technique is applied to the power amplifier shown in FIG. 14.

Signal generating circuit shown in FIG. 15 includes amplitude detector 303 extracting an AM component (i.e., a modulated wave signal) from an input RF signal, limiter 302 extracting an AM component from the input signal, and signal divider 317 dividing the AM component of the input signal extracted by amplitude detector 303. In addition, signal generating circuit 347 shown in FIG. 15 includes delay equalizer 358, which allows controlling the delay time difference between the AM component of the input signal extracted by amplitude detector 303 and a PM component extracted by limiter 302.

Amplitude modulator 303 extracts the AM component of the RF signal (i.e., a modulated wave signal) inputted from terminal 343, and outputs the AM component to signal divider 317. Signal divider 317 divides AM component a(t) of the input signal with amplitude components $a_1(t)$ through $a_n(t)$ satisfying the following relationship: a(t) proportional to $a_1(t)a_2(t) \ldots a_n(t)$, and outputs control signals $318_1$ to $313_n$ having amplitude components $a_1(t)$ to $a_n(t)$ through terminals $353_1$ to $353_n$, respectively. Limiter 302 removes the AM component of the RF signal, the delay time of which is controlled by delay equalizer 358, and outputs the remaining PM component as phase component signal 312 through terminal 346.

As in the first embodiment, signal divider 317 of this embodiment can be implemented with, for example, a DSP, equipped with an ND converter or a D/A converter, or an operation circuit constructed with an analog circuit. Signal divider 317 can preferably have a function of appropriately controlling the time difference between first control signals $318_1$ to $313_n$ that are outputted from signal divider 317.

While an example in which analog signals are outputted as control signals $318_1$ to $313_n$ from signal processing circuit 347 has been illustrated with reference to FIG. 14, signal processing circuit 347 can have functions of first pulse modulator $320_1$ to $320_n$ when signal processing circuit 347 includes signal divider 317 constructed with a DSP. In this case, driver amplifiers $321_2$ to $321_n$ of first to $n^{th}$ control signal amplifiers $300_1$ to $300_n$ may be omitted, and control signals $318_1$ to $313_n$ may be directly inputted to switching amplifiers $324_2$ to $324_n$.

As shown in FIG. 16, signal processing circuit 347 can have the same configuration as the circuit shown in FIG. 15 except that limiter 302 is excluded. In the configuration shown in FIG. 16, a modulated wave signal containing AM and PM components is outputted from terminal 346. Amplitude detector 303, signal divider 317 and delay equalizer 358 have the same configuration and operation as in signal generating circuit 347 of FIG. 15

Figure 17:
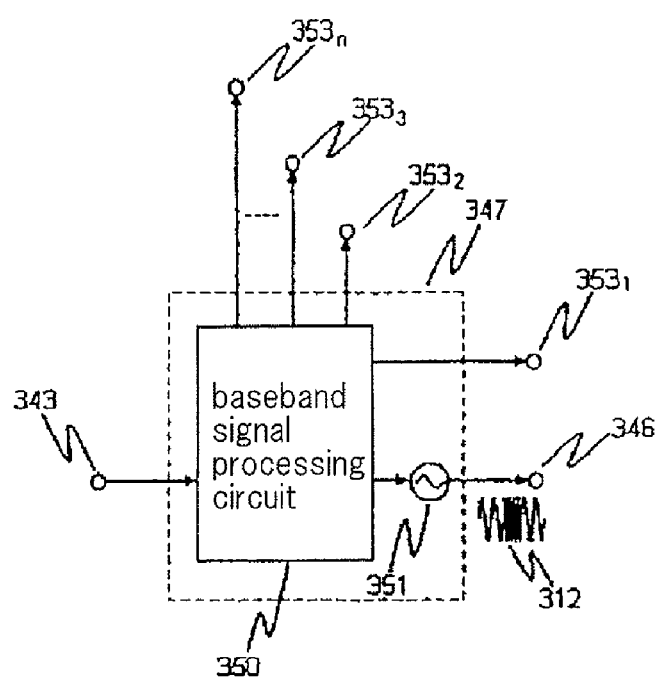
FIG. 17 is a block diagram illustrating a further configuration of the signal generating circuit shown in FIG. 14.
Figure 18:
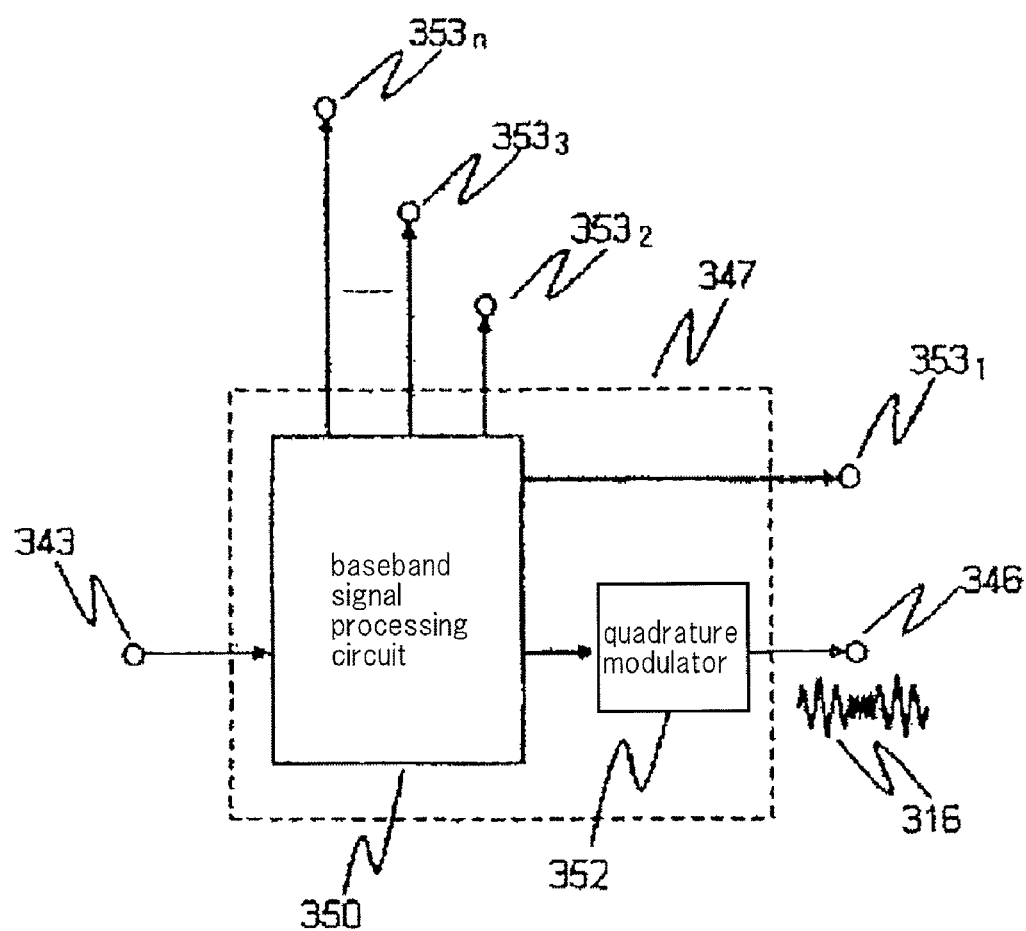
FIG. 18 is a block diagram illustrating still another configuration of the signal generating circuit shown in FIG. 14.

FIGS. 17 and 18 are block diagrams illustrating different configurations of the signal generating circuit shown in FIG. 14.

Signal generating circuit 347 shown in FIGS. 17 and 18 is of an optimum configuration to be used when a baseband signal is inputted to the input terminal of power amplifier shown in FIG. 14. Here, FIG. 17 illustrates a configuration of signal generating circuit 347 in which the EER technique is applied to the power amplifier shown in FIG. 14, and FIG. 18 illustrates a configuration of signal generating circuit 347 in which the ET technique is applied to the power amplifier shown in FIG. 14.

Signal processing circuit 347 shown in FIG. 17 includes baseband signal processing circuit 350 and VCO 351. Baseband signal processing circuit 350 preferably includes a DSP and a D/A converter. Baseband signal processing circuit 350 calculates and divides AM component a(t) of a baseband signal inputted from terminal 343 into amplitude components $a_1(t)$ to $a_n(t)$, which satisfy the following relationship: a(t) proportional to $a_1(t)a_2(t) \ldots a_n(t)$, by digitization, using the DSP. After signals $a_1(t)$ to $a_n(t)$ are converted into analog signals by the D/A converter, control signals $318_1$ to $318_n$ having amplitude components $a_1(t)$ to $a_n(t)$ are outputted through terminals $353_1$ to $353_n$. In addition, baseband signal processing circuit 350 calculates and extracts a PM component of the baseband signal inputted through terminal 343 by digitization, using the DSP. Baseband signal processing circuit 350 also generates a control signal for outputting a phase component signal from VCO 351, converts the control signal into an analog signal using the D/A converter, and outputs the signal to VCO 351. The function of baseband signal processing circuit 350 to control the delay time difference between the AM and PM components of the baseband signal can be preferably realized by the DSP.

The output frequency of VCO 351 is controlled by a control signal outputted from baseband signal processing circuit 350, and VCO 351 outputs a phase component signal that is up-converted to an RF frequency.

In the case where signal processing circuit 347 includes baseband signal processing circuit 350 constructed with the DSP, baseband signal processing circuit 350 may have functions of pulse modulators $320_1$ to $320_n$. Then, first control signals $318_1$ to $318_n$ may be directly inputted to driver amplifiers $321_1$ to $321_n$.

As shown in FIG. 18, signal generating circuit 347 can be provided with quadrature modulator 352 in place of VCO 351 shown in FIG. 17. In the configuration shown in FIG. 18, a modulated wave signal containing AM and PM components is outputted from terminal 346. Baseband signal processing circuit 350 have the same configuration and operation as in signal generating circuit 347 of FIG. 17.

In the power amplifier of the second embodiment, a signal amplified by switching amplifier $324_n$ is fed as a supply voltage to switching amplifier $324_{n-1}$ after a spurious component of a square wave is removed from the signal by low-pass filter $306_n$.

Hence, the output signal of switching amplifier $324_{n-1}$ is amplitude-modulated by the output signal $314_n$ of low-pass filter $306_n$.

In addition, a signal amplified by switching amplifier $324_{n-1}$ is also fed as a supply voltage to switching amplifier $324_{n-2}$ after a spurious component of a square wave is removed from the signal by low-pass filter $306_{n-1}$. Accordingly, the output signal of switching amplifier $324_{n-2}$ is amplitude-modulated by output signal $314_{n-1}$ of low-pass filter $306_{n-1}$. Likewise, the output signal of respective switching amplifiers 324 is amplitude-modulated by output signal 314 of low-pass filter 306 of the rear control signal amplifying unit.

Here, signal $314_1$ proportional to amplitude signal, meaning that a multiplication of control signals $318_1$-$318_n$, is obtained from low-pass filter $306_1$ by removing an overlapping spurious component of a square wave from output signal $359_1$ of switching amplifier $324_1$ using low-pass filter $306_1$.

Like the power amplifier of the background art to which the EER or ET technique is applied, a phase component signal or a modulated wave signal containing AM and PM components from signal generating circuit 347 is inputted to RF amplifier 309, which in turn amplifies the phase component signal or modulated wave signal while operating in saturation mode. Here, an output signal from RF amplifier 309 is amplitude-modulated by signal $314_1$ from low-pass filter $306_1$. The output signal of RF amplifier 309 is passed through band-pass filter 307, the frequency band of which is wider than the frequency band of a baseband signal and can remove a spurious component caused by a square wave signal. This, as a result, removes the unnecessary overlapping spurious component from the output signal of RF amplifier 309 thereby producing a desired RF signal that is a linearly amplified signal of the input signal.

As described above, in the power amplifier of the second embodiment, the dynamic range of control signals $318_1$ to $318_n$ ($a_1(t)$ to $a_n(t)$) is set to be smaller than that of AM component a(t) of the original input signal. As a result, a supply voltage of respective switching amplifiers that is decreased in the low power mode reduces switching loss proportional to the supply voltage more than a fixed amount of supply voltage does. This also suppresses a decline in power efficiency in the low power mode. In addition, since a signal having a narrower dynamic range than the original PM component is used as a control signal, a low amplitude operation in the switching amplifier is avoided and thus a decline in power efficiency is suppressed. Accordingly, power efficiency in the low amplitude operation of the switching amplifier has improved over that of the background art, and the entire power efficiency of the power amplifier is improved.

In particular, since the power amplifier of the second embodiment divides an amplitude signal by a multiplication of more control signals than the power amplifier of the first embodiment does, the dynamic range of respective control signal is further reduced, and thus the supply voltage of the switching amplifier is more precisely controlled. Accordingly, the advantage is that a decline in the power efficiency of the power amplifier can be further suppressed.

In the meantime, examples of control signals $318_1$ to $318_n$ ($a_1(t)$ to $a_n(t)$) satisfying the relationship: a(t) proportional to $a_1(t)a_2(t) \ldots a_n(t)$ may be expressed by $a_1(t)$ proportional to $[a(t)]^{n1}$, $a_2(t)$ proportional to $[a(t)]^{n2}$, ..., $a_n(t)$ proportional to $[a(t)]^{nn}$, where n1+n2+ ... +nn=1. In this case, each of n1, n2, ..., and nn is preferably smaller than 1 in order to satisfy the condition that the dynamic range of amplitude components $a_1(t)$ to $a_n(t)$ be smaller than that of AM component a(t). Here, $[a(t)]^{n1}$, $[a(t)]^{n2}$, and $[a(t)]^{nn}$ indicate exponentiation of a(t).

In addition, control signals $318_1$ to $318_n$ ($a_1(t)$ to $a_n(t)$) can be set to values shown in FIG. 13 like the first embodiment. Specifically, at least one of control signals $318_1$ to $318_n$ ($a_1(t)$ to $a_n(t)$) can be set to be a fixed value if a(t) is at least threshold $a_{ref}$, and can be set to be proportional to a(t) if a(t) is smaller than threshold $a_{ref}$. In this case, another control signal can be preferably set to be proportional to a(t) if a(t) is at least threshold $a_{ref}$, and can be set to be a fixed value if a(t) is smaller than threshold $a_{ref}$.

When control signals $318_1$ to $318_n$ are set as above, a decline in the power efficiency of switching amplifiers $324_1$ to $324_n$ is suppressed since the dynamic range of these signals is smaller than original AM component a(t). In addition, since control signals $318_1$ to $318_n$ ($a_1(t)$ to $a_n(t)$) satisfy the relationship: a(t) proportional to $a_1(t)a_2(t) \ldots a_n(t)$, linear amplification of an input signal is realized. The same operation can be realized by exchanging the positions of $a_1(t)$ to $a_n(t)$.

The method of setting control signals $318_1$ to $318_n$ is not limited to the above-described examples. Rather, any values can be adopted as long as at least one of control signals $318_1$ to $318_n$ has a smaller dynamic range than original AM component a(t), where a(t) proportional to $a_1(t)a_2(t) \ldots a_n(t)$.

The present application claims priority from Japanese Patent Application Number 2007-013746, filed Jan. 24, 2007, the disclosure of which is hereby incorporated by reference herein in its entirety.

The invention claimed is:

1. A power amplifier for amplifying a modulated wave signal containing amplitude and phase modulation components, comprising:

a signal generating circuit extracting an amplitude modulation component from the modulated wave signal, outputting the amplitude modulation component by dividing the amplitude modulation component into a plurality of control signals, and extracting and outputting a phase modulation component from the modulated wave signal;

a plurality of control signal amplifiers amplifying the control signals; and a radio frequency amplifier outputting the phase modulation component by amplifying the phase modulation component and performing amplitude modulation on the modulated wave signal using output signals from the control signal amplifiers, wherein an output signal from the first control signal amplifier is fed as a supply voltage to the radio frequency amplifier, and an output signal from the $n^{th}$ control signal amplifier is fed as a supply voltage to the switching amplifier of the $n-1^{th}$ control signal amplifier, where n is an integer greater than 2.

2. A power amplifier for amplifying a modulated wave signal containing amplitude and phase modulation components, comprising:

a signal generating circuit extracting an amplitude modulation component from the modulated wave signal, outputting the amplitude modulation component by dividing the amplitude modulation component into a plurality of control signals, and outputting the modulated wave signal;

a plurality of control signal amplifiers amplifying the control signals; and a radio frequency amplifier outputting the modulated wave signal by amplifying the modulated wave signal while performing amplitude modulation on the modulated wave signal using an output signal from the control signal amplifiers, wherein an output signal from the first control signal amplifier is fed as a supply voltage to the radio frequency amplifier, and an output signal from the $n^{th}$ control signal amplifier is fed as a supply voltage to the switching amplifier of the $n-1^{th}$ control signal amplifier, where n is an integer greater than 2.

3. A power amplifier for amplifying a modulated wave signal containing amplitude and phase modulation components, comprising:

a signal generating circuit extracting an amplitude modulation component from the modulated wave signal, outputting the amplitude modulation component by dividing the amplitude modulation component into a plurality of control signals, and extracting and outputting a phase modulation signal from the modulated wave signal;

a plurality of control signal amplifiers, wherein each of the control signal amplifiers includes a pulse modulator modulating a pulse of the control signals, a switching amplifier amplifying a current of a square wave signal from the pulse modulator, and a low-pass filter removing a spurious component caused by the square wave signal from an output signal of the switching amplifier; and a radio frequency amplifier outputting the phase modulation component by amplifying the phase modulation component and performing amplitude modulation on the modulated wave signal using an output signal from the low-pass filter, wherein an output signal from the low-pass filter of the first control signal amplifier is fed as a supply voltage to the radio frequency amplifier, and an output signal from the low-pass filter of the $n^{th}$ control signal amplifier is fed as a supply voltage to the switching amplifier of the $n-1^{th}$ control signal amplifier, where n is an integer greater than 2.

4. A power amplifier for amplifying a modulated wave signal containing amplitude and phase modulation components, comprising:

a signal generating circuit extracting the amplitude modulation component from the modulated wave signal, outputting the amplitude modulation component by dividing the amplitude modulation component into a plurality of control signals, and outputting the modulated wave signal;

a plurality of control signal amplifiers, wherein each of the control signal amplifiers includes a pulse modulator modulating a pulse of the control signals, a switching amplifier amplifying a current of a square wave signal from the pulse modulator, and a low-pass filter removing a spurious component caused by the square wave signal from an output signal of the switching amplifier; and a radio frequency amplifier outputting the modulated wave signal by amplifying the modulated wave signal while performing amplitude modulation on the modulated wave signal using an output signal from the low-pass filter, wherein an output signal from the low-pass filter of the first control signal amplifier is fed as a supply voltage to the radio frequency amplifier, and an output signal from the low-pass filter of the $n^{th}$ control signal amplifier is fed as a supply voltage to the switching amplifier of the $n-1^{th}$ control signal amplifier, where n is an integer greater than 2.

5. The power amplifier of claim 1, wherein the control signals are signals whose multiplication of which is proportional to the amplitude modulation component.

6. The power amplifier of claim 5, wherein the signal generating circuit controls a time difference between the control signals.

7. The power amplifier of claim 5, wherein at least one of the control signals has a dynamic range smaller than that of the amplitude modulation component of the modulated wave signal.

8. The power amplifier of claim 7, wherein at least one of the control signals is obtained by an exponent of the amplitude modulation component of the modulated wave signal.

9. The power amplifier of claim 7, wherein one of the control signals is proportional to the amplitude modulation component of the modulated wave signal when the amplitude modulation component of the modulated wave signal is at least a predetermined threshold, or is fixed when the amplitude modulation component of the modulated wave signal is smaller than the predetermined threshold.

10. A method for amplifying power, comprising:

extracting an amplitude modulation component from a modulated wave signal containing amplitude modulation and phase modulation components;

dividing the phase modulation component into a plurality of control signals and amplifying the control signals;

modulating the $n-1^{th}$ amplified control signal using the $n_{th}$ amplified control signal, where n is an integer greater than 2;

extracting the phase modulation component from the modulated wave signal;

amplifying the phase modulation component extracted from the modulated wave signal by a radio frequency amplifier; and performing amplitude modulation on an output signal from the radio frequency amplifier using the first amplified control signal.

11. A method for amplifying power, comprising:

extracting an amplitude modulation component from a modulated wave signal containing amplitude modulation and phase modulation components;

dividing the phase modulation component into a plurality of control signals and amplifying the control signals;

modulating the n−1$^{th}$ amplified control signal using the n$_{th}$ amplified control signal, where n is an integer greater than 2;

amplifying the modulated wave signal by a radio frequency amplifier; and performing amplitude modulation on an output signal from the radio frequency amplifier using the first amplified control signal.

12. The power amplifier of claim 2, wherein the control signals are signals whose multiplication of which is proportional to the amplitude modulation component.

13. The power amplifier of claim 12, wherein the signal generating circuit controls a time difference between the control signals.

14. The power amplifier of claim 12, wherein at least one of the control signals has a dynamic range smaller than that of the amplitude modulation component of the modulated wave signal.

15. The power amplifier of claim 14, wherein at least one of the control signals is obtained by an exponent of the amplitude modulation component of the modulated wave signal.

16. The power amplifier of claim 14, wherein one of the control signals is proportional to the amplitude modulation component of the modulated wave signal when the amplitude modulation component of the modulated wave signal is at least a predetermined threshold, or is fixed when the amplitude modulation component of the modulated wave signal is smaller than the predetermined threshold.

17. The power amplifier of claim 3, wherein the control signals are signals whose multiplication of which is proportional to the amplitude modulation component.

18. The power amplifier of claim 17, wherein the signal generating circuit controls a time difference between the control signals.

19. The power amplifier of claim 17, wherein at least one of the control signals has a dynamic range smaller than that of the amplitude modulation component of the modulated wave signal.

20. The power amplifier of claim 19, wherein at least one of the control signals is obtained by an exponent of the amplitude modulation component of the modulated wave signal.

21. The power amplifier of claim 19, wherein one of the control signals is proportional to the amplitude modulation component of the modulated wave signal when the amplitude modulation component of the modulated wave signal is at least a predetermined threshold, or is fixed when the amplitude modulation component of the modulated wave signal is smaller than the predetermined threshold.

22. The power amplifier of claim 4, wherein the control signals are signals whose multiplication of which is proportional to the amplitude modulation component.

23. The power amplifier of claim 22, wherein the signal generating circuit controls a time difference between the control signals.

24. The power amplifier of claim 22, wherein at least one of the control signals has a dynamic range smaller than that of the amplitude modulation component of the modulated wave signal.

25. The power amplifier of claim 24, wherein at least one of the control signals is obtained by an exponent of the amplitude modulation component of the modulated wave signal.

26. The power amplifier of claim 24, wherein one of the control signals is proportional to the amplitude modulation component of the modulated wave signal when the amplitude modulation component of the modulated wave signal is at least a predetermined threshold, or is fixed when the amplitude modulation component of the modulated wave signal is smaller than the predetermined threshold.

* * * * *

UNITED STATES PATENT AND TRADEMARK OFFICE
CERTIFICATE OF CORRECTION

| | |
|---|---|
| PATENT NO. | : 7,855,599 B2 |
| APPLICATION NO. | : 12/524263 |
| DATED | : December 21, 2010 |
| INVENTOR(S) | : Shingo Yamanouchi |

It is certified that error appears in the above-identified patent and that said Letters Patent is hereby corrected as shown below:

Column 12, Line 36: delete "FIG.15" and insert -- FIG. 15 --

Column 14, Line 25: delete "$[a(t)]^{n^2}$," and insert -- $[a(t)]^{n^2},...,$ --

Column 16, Line 52: In claim 10, delete "$n_{th}$" and insert -- $n^{th}$ --

Column 17, Line 1: In claim 11, delete "$n_{th}$" and insert -- $n^{th}$ --

Signed and Sealed this
Tenth Day of January, 2012

David J. Kappos
*Director of the United States Patent and Trademark Office*